United States Patent
Young et al.

(10) Patent No.: US 9,774,716 B2
(45) Date of Patent: Sep. 26, 2017

(54) OVERSTRESS INDICATOR

(71) Applicant: SKYWORKS SOLUTIONS, INC., Woburn, MA (US)

(72) Inventors: James Phillip Young, Cedar Rapids, IA (US); Matthew Lee Banowetz, Marion, IA (US); Leo John Wilz, Cedar Rapids, IA (US); Ali J. Mahmud, Cedar Rapids, IA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/388,273

(22) Filed: Dec. 22, 2016

(65) Prior Publication Data

US 2017/0187857 A1    Jun. 29, 2017

Related U.S. Application Data

(60) Provisional application No. 62/271,600, filed on Dec. 28, 2015.

(51) Int. Cl.
| | |
|---|---|
| H04W 24/00 | (2009.01) |
| H04M 1/24 | (2006.01) |
| H03F 3/21 | (2006.01) |
| H03F 3/19 | (2006.01) |
| H03F 1/52 | (2006.01) |
| G01R 31/28 | (2006.01) |

(52) U.S. Cl.
CPC ............ *H04M 1/24* (2013.01); *G01R 31/282* (2013.01); *G01R 31/2844* (2013.01); *H03F 1/52* (2013.01); *H03F 3/19* (2013.01); *H03F 3/21* (2013.01); *H03F 2200/426* (2013.01); *H03F 2200/451* (2013.01)

(58) Field of Classification Search
None
See application file for complete search history.

(56) References Cited

U.S. PATENT DOCUMENTS

2013/0027129 A1*  1/2013  Langer ................. H04B 1/0458
                                                    330/127
2017/0040948 A1*  2/2017  Levesque ............... H03F 3/195

* cited by examiner

*Primary Examiner* — Idowu O Osifade
(74) *Attorney, Agent, or Firm* — Lando & Anastasi, LLP

(57) ABSTRACT

According to one aspect, embodiments of the invention provide an overstress indicator circuit comprising a sense circuit configured to monitor a parameter of a device and generate a sense signal corresponding to the parameter, a detection circuit coupled to the sense circuit and configured to receive the sense signal from the sense circuit and generate a detection signal at a first level in response to a determination that the sense signal is indicative of an overstress condition in the device, an interface circuit, and a memory circuit coupled to the detection circuit and the interface circuit and configured to store an overstress condition indication for access via the interface circuit in response to receiving the detection signal at the first level.

20 Claims, 7 Drawing Sheets

OVERSTRESS INDICATOR

CROSS REFERENCE TO RELATED APPLICATION

This application claims priority to U.S. Provisional Application Ser. No. 62/271,600 entitled "OVERSTRESS INDICATOR," filed on Dec. 28, 2015, which is incorporated herein by reference in its entirety.

BACKGROUND

1. Field of Invention

Aspects and embodiments of the present invention relate generally to overstress indicators in electronic devices.

2. Discussion of Related Art

Many different types of electronic devices include overstress indicators that identify when a device has been operated outside of its intended use and/or outside of a predetermined operational parameter. Overstress indicators typically aid in categorizing and troubleshooting failed electronic devices and may help a device manufacturer to identify whether a returned electronic device has failed due to a defect or due to an external condition.

For example, mobile devices (e.g., mobile phones) typically include at least one overstress indicator that identifies when a specific electrical and/or environmental overstress condition in the mobile device is, or at least has been, present. For instance, an overstress indicator in a mobile device may indicate an overstress condition when a voltage applied across the device's battery is greater than a threshold level. Such an overstress indicator may assist a mobile device manufacturer in identifying whether a failure of the mobile device is due to a defect in the device or due to an external condition (potentially imposed by the user).

SUMMARY

Aspects in accord with the present invention are directed to an overstress indicator circuit comprising a sense circuit configured to monitor a parameter of a device and generate a sense signal corresponding to the parameter, a detection circuit coupled to the sense circuit and configured to receive the sense signal from the sense circuit and generate a detection signal at a first level in response to a determination that the sense signal is indicative of an overstress condition in the device, an interface circuit, and a memory circuit coupled to the detection circuit and the interface circuit and configured to store an overstress condition indication for access via the interface circuit in response to receiving the detection signal at the first level.

According to one embodiment, the interface circuit is a serial interface circuit. In one embodiment, the serial interface circuit is a Mobile Industry Processor Interface (MIPI) Alliance Specification for RF Front-End (RFFE) Control Interface circuit.

According to another embodiment, the detection circuit includes a voltage reference configured to provide a reference voltage, and a comparator coupled to the voltage reference and the sense circuit, the comparator configured to compare the reference voltage with a voltage of the sense signal, to output the detection signal at a second level in response to determining that the voltage of the sense signal is less than the reference voltage, and to output the detection signal at the first level in response to determining that the voltage of the sense signal has exceeded the reference voltage. In one embodiment, the voltage reference is a bandgap voltage reference.

According to one embodiment, the sense circuit is an input line configured to be coupled to a node within the device and to provide the sense signal to the comparator in relation to a voltage across the node, the comparator being further configured to output the detection signal at the first level in response to determining that the voltage of the sense signal from the input line has exceeded the reference voltage. In another embodiment, the sense circuit is a current sensor coupled to a node within the device and configured to output the sense signal to the comparator in relation to a current to or from the node, the comparator being further configured to output the detection signal at the first level in response to determining that the voltage of the sense signal from the current sensor has exceeded the reference voltage. In another embodiment, the sense circuit is a temperature sensor located within the device and configured to output the sense signal to the comparator in relation to a temperature of the device, the comparator being further configured to output the detection signal at the first level in response to determining that the voltage of the sense signal from the temperature sensor has exceeded the reference voltage. In one embodiment, the temperature sensor includes one of a thermistor and a PTAT circuit coupled to the comparator.

According to another embodiment, the sense circuit is an accelerometer located within the device and configured to output the sense signal to the comparator in relation to an acceleration of the device, the comparator being further configured to output the detection signal at the first level in response to determining that the voltage of the sense signal from the accelerometer has exceeded the reference voltage. In another embodiment, the sense circuit is a moisture indicator located within the device and configured to output the sense signal to the comparator in relation to a determination by the liquid indicator that the device has been exposed to a liquid, the comparator being further configured to output the detection signal at the first level in response to determining that the voltage of the sense signal from the liquid indicator has exceeded the reference voltage. In another embodiment, the sense circuit is an Electro-Static Discharge (ESD) indicator located within the device and configured to output the sense signal to the comparator in relation to an ESD incident on the device, the comparator being further configured to output the detection signal at the first level in response to determining that the voltage of the sense signal from the static indicator has exceeded the reference voltage. In another embodiment, the sense circuit is an RF power indicator located within the device and configured to output the sense signal to the comparator in relation to RF power incident on the device, the comparator being further configured to output the detection signal at the first level in response to determining that the voltage of the sense signal from the RF power indicator has exceeded the reference voltage.

According to one embodiment, the memory circuit includes a memory element configured to be permanently altered into a state indicating an overstress condition in response to receiving the detection signal at the first level. In one embodiment, the memory circuit further includes a memory element detection circuit coupled to the memory element and configured to generate the overstress condition indication in response to a determination that the memory element has been altered into the state indicating an overstress condition.

According to one embodiment, the memory element is a polysilicon fuse configured to be fused open in response to receiving the detection signal at the first level, and the memory element detection circuit is further configured to monitor an impedance of the polysilicon fuse and generate the overstress condition indication in response to a determination that the impedance of the polysilicon fuse has been altered into a high-impedance state. In another embodiment, the memory element is an antifuse element configured to be fused closed in response to receiving the detection signal at the first level, and the memory element detection circuit is further configured to monitor an impedance of the antifuse element and generate the overstress condition indication in response to a determination that the impedance of the antifuse element has been altered into a low-impedance state. In another embodiment, the memory element includes a transistor having a gate that is permanently pulled low in response to receiving the detection signal at the first level, and the memory element detection circuit is further configured to monitor a voltage on the gate of the transistor and generate the overstress condition indication in response to a determination that the voltage on the gate of the transistor has dropped below a threshold. In one embodiment, the transistor is a Field-Effect Transistor (FET).

According to one embodiment, the detection circuit is further configured to generate the detection signal at the first level in response to a determination that a voltage of the sense signal is greater than a first reference voltage, to generate the detection signal at a second level in response to a determination that the voltage of the sense signal is in a range between a second reference voltage and the first reference voltage, and to generate the detection signal at a third level in response to a determination that the voltage of the sense signal is in a range between a third reference voltage and the second reference voltage. In one embodiment, the memory circuit includes a first memory element configured to be permanently altered in response to receiving the detection signal at the first level, a second memory element configured to be permanently altered in response to receiving the detection signal at the second level, and a third memory element configured to be permanently altered in response to receiving the detection signal at the third level. In another embodiment, the memory circuit further includes a memory element detection circuit coupled to the first memory element, the second memory element, and the third memory element, the memory element detection circuit configured to store information regarding the voltage of the sense signal for access via the interface circuit based on a status of the first memory element, the second memory element, and the third memory element, and to generate the overstress condition indication in response to a determination that the first memory element has been permanently altered.

Another aspect in accord with the present invention is directed to a module comprising an overstress indicator circuit (e.g., as described in any of the embodiments discussed above), and at least one power amplifier coupled to the interface circuit. In one embodiment, the module further comprises at least one filter coupled to the at least one power amplifier. In another embodiment, the module further comprises an antenna switch module coupled to the at least one filter. In one embodiment, at least one of the overstress indicator circuit, the at least one power amplifier, the at least one filter, and the antenna switch module are fabricated on at least one die. In one embodiment, the at least one die is located on a circuit board constructed of glassy epoxy laminate. In one embodiment, at least one of the overstress indicator circuit, the at least one power amplifier, the at least one filter, and the antenna switch module are encapsulated in a molding compound. In another embodiment, the module further comprises at least one contact coupled to at least one of the overstress indicator circuit, the at least one power amplifier, the at least one filter, and the antenna switch module.

At least one aspect in accord with the present invention is directed to a wireless device comprising a module (e.g., as described in any of the embodiments discussed above), and a transceiver configured to produce an RF transmit signal and to receive an RF receive signal. In one embodiment, the wireless device further comprises at least one antenna coupled to the antenna switch module and configured to transmit the RF transmit signal and to receive the RF receive signal. In one embodiment, the wireless device further comprises at least one of a battery, a computer readable medium, and at least one processor. In another embodiment, the wireless device further comprises an RF coupler coupled between the at least one antenna and the antenna switch module. In one embodiment, the wireless device further comprises a controller coupled to the detection circuit of the overstress indicator circuit and configured to receive the detection signal at the first level from the detection circuit and operate the at least one power amplifier based on the detection signal.

According to one embodiment, the wireless device further comprises a bus, and a controller coupled to the memory circuit of the overstress indicator circuit via the interface circuit and the bus and configured to receive the overstress condition indication from the memory circuit and operate or alter a function of the wireless device based on the overstress condition indication.

Another aspect in accord with the present invention is directed to a system comprising an overstress indicator circuit (e.g., as described in any of the embodiments discussed above), at least one power amplifier coupled to the interface circuit, and a controller coupled to the detection circuit of the overstress indicator circuit and configured to receive the detection signal from the detection circuit and operate the at least one power amplifier based on the detection signal.

In one embodiment, the system further comprises at least one filter coupled to the at least one power amplifier. In one embodiment, the system further comprises an antenna switch module coupled to the at least one filter. In one embodiment, the system further comprises a transceiver coupled to the antenna switch module and configured to produce an RF transmit signal and to receive an RF receive signal. In one embodiment, the system further comprises at least one antenna coupled to the antenna switch module and configured to transmit the RF transmit signal and to receive the RF receive signal. In one embodiment, the system further comprises at least one of a battery, a computer readable medium, and at least one processor. In another embodiment, the system further comprises an RF coupler coupled between the at least one antenna and the antenna switch module.

BRIEF DESCRIPTION OF THE DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Figure 1A:
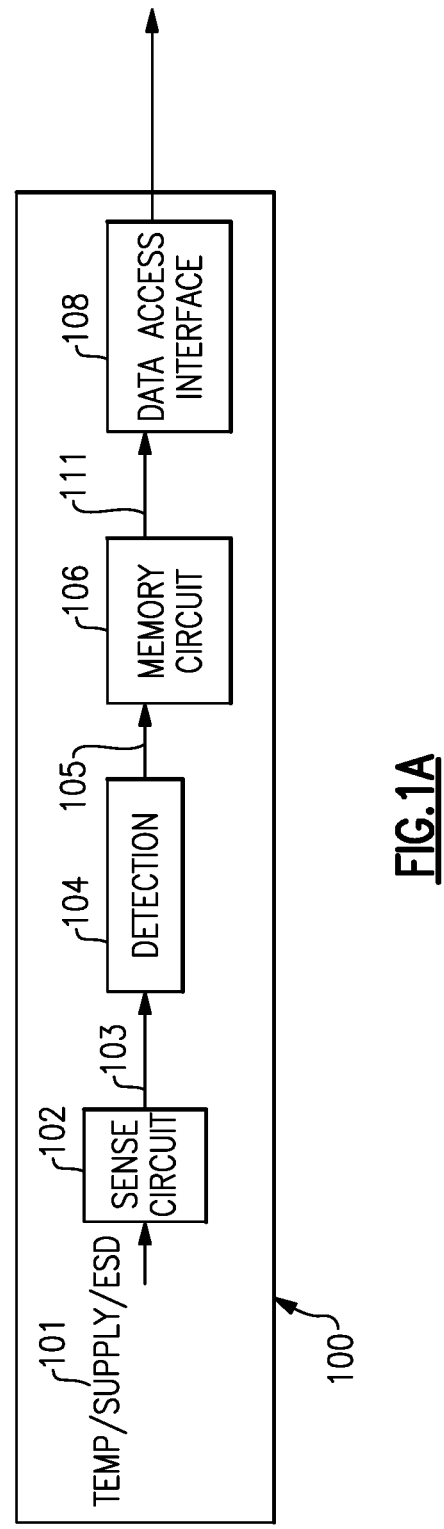
FIG. 1A is a block diagram of an overstress indicator circuit in accordance with aspects of the present invention.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

As discussed above, overstress indicators may be included in electronic devices, such as mobile devices, to identify when an electronic device has been operated outside of its intended use and/or outside of a predetermined operational parameter, such as design specifications of the device. However, current overstress indicators are limited in the information they are capable of providing. For example, some current overstress indicators operate to shut down an electronic device in response to the device being operated outside of a predetermined parameter, but do not easily provide information regarding the overstress condition or the resulting shutdown to an operator of the device. For example, with some overstress indicators, the overstress condition of the electronic device can only be analyzed and identified with destructive analysis to the device, with the device being rendered inoperable by the analysis.

Accordingly, an overstress indicator circuit is provided that is capable of sampling an overstress detector, storing an indication of an overstress event, and allowing for the non-destructive retrieval of the overstress event indication. The overstress indicator circuit described herein allows an investigator to retrieve overstress condition information without destroying the corresponding device. The overstress indicator circuit can also be used to gain a better understanding of the operating conditions that may have caused the failure of a device and this information can be used to improve future designs to better withstand extreme operating conditions.

FIG. 1A is a block diagram of an overstress indicator circuit 100. The overstress indicator circuit 100 includes a sense circuit 102, a detection circuit 104, a memory circuit 106, and a data access interface 108. The sense circuit 102 is coupled to the detection circuit 104. The memory circuit 106 is coupled to the detection circuit 104. The data access interface 108 is coupled to the memory circuit 106.

Figure 1B:
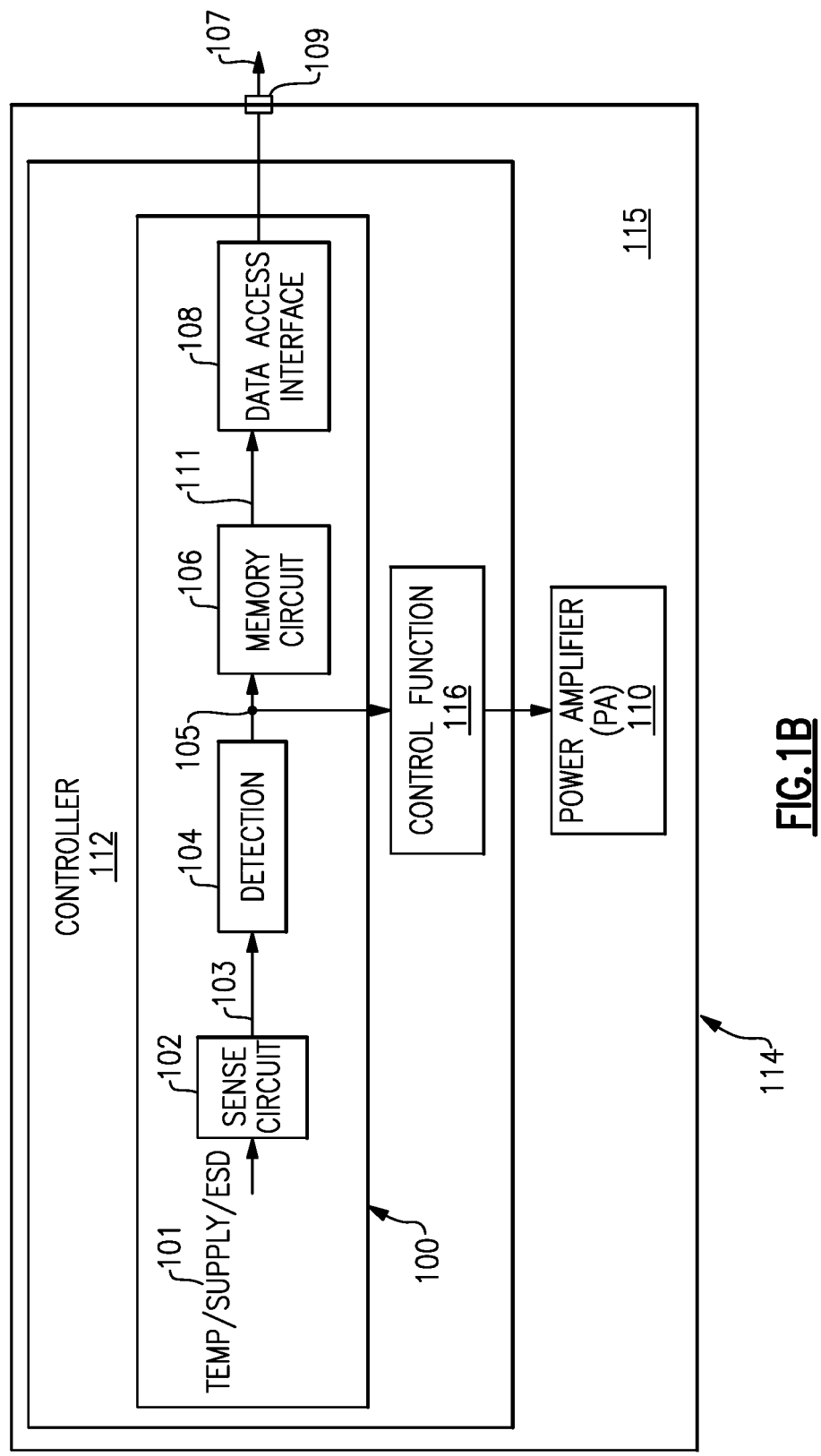
FIG. 1B is a block diagram of an overstress indicator circuit associated with a power amplifier in accordance with aspects of the present invention.

According to one embodiment, for example as shown in FIG. 1B, the overstress indicator circuit 100 is associated with a power amplifier 110 in a mobile device. For example, in one embodiment, the overstress indicator circuit 100 is located within the same packaged module 114 as the power amplifier 110 within a mobile device. For instance, according to one embodiment (shown in FIG. 1B), the overstress indicator circuit 100 is implemented within a controller 112 (e.g., as part of the controller 112 CMOS die, or implemented on a same substrate, or in a same module, as the controller 112) that is located within the same packaged module 114 as the power amplifier 110. However, in other embodiments, the overstress indicator circuit 100 may be associated with another electrical component of a corresponding electronic device, with multiple electrical components of the device, and/or may be configured in other appropriate ways.

The overstress indicator circuit 100 is configured to monitor an electrical and/or environmental parameter 101 of its corresponding electronic device, identify when an overstress condition exists in the device and provide the overstress condition information to an external system or another component within the device, without requiring destructive analysis of the device. For example, as shown in FIG. 1B, the sense circuit 102 is configured to monitor a desired parameter of the mobile device and provide information 103 regarding the desired parameter to the detection circuit 104. The detection circuit 104 is configured to identify, based on the information received from the sense circuit 102, whether the monitored parameter indicates an overstress condition in the device.

According to at least one embodiment, information from the detection circuit 104 (i.e., information indicating whether the parameter monitored by the sense circuit 102 indicates an overstress condition) is provided to the controller 112 and the controller 112 operates based on the information from the detection circuit 104. For example, in one embodiment, the information from the detection circuit 104 is provided to a control function module 116 of the controller 112. According to one embodiment, the control function module 116 is a PA bias generator coupled to the PA 110; however, in other embodiments, the control function module 116 may be another type of control module.

Upon receiving information from the detection circuit 104 indicating that the parameter monitored by the sense circuit 102 indicates an overstress condition, the control function module 116 of the controller 112 may recognize that the detection circuit 104 has identified an overstress condition and as a result, take action to prevent damage to the device (e.g., shut down the PA bias to the PA 110 to turn off the PA 110). In other embodiments, the controller 112 may take some other action in response to receiving information from the detection circuit 104 indicating an overstress condition.

The memory circuit 106 is configured to determine whether the detection circuit 104 has identified an overstress condition in the device and generate/store an overstress condition indication 111 in response to determining that the detection circuit 104 has identified an overstress condition. According to one embodiment, the overstress condition indication 111 generated/stored by the memory circuit 106 may be read out, by an external system, via the data access interface 108. For example, according to one embodiment, the overstress condition indication 111 generated/stored by the memory circuit 106 is read out from the memory circuit 106, via the data access interface 108 and a serial port 107, by an external failure analysis system. In another embodiment, the overstress condition indication 111 generated/stored by the memory circuit 106 is read out from the memory circuit 106 by another component in the corresponding electronic device (e.g., a processor). In other embodiments, the overstress condition indication 111 may be read out by any other appropriate component within the packaged module 114 or within the corresponding electronic device via the serial port 107 and/or data access interface 108. In one embodiment, the data access interface 108 is a Mobile Industry Processor Interface (MIPI) Alliance Specification for RF Front-End (RFFE) Control Interface; however, in other embodiments, the data access interface 108 may be any other appropriate type of bus and/or serial interface. By providing the overstress condition indication 111 to the data access interface 108, overstress condition information can be retrieved from the device non-destructively by an external system.

As discussed above, the data access interface 108 either provides the overstress condition indication 111 from the memory circuit to another component/device or allow access to the overstress condition indication 111 stored in the memory circuit 106. However, in at least one other embodiment, the data access interface 108 is also coupled to the detection circuit 104 and is configured to also provide the detection signal 105 to another component/device via the serial port 107. In this way, the data access interface 108 can provide both an indication of a current overstress condition (i.e. the detection signal 105) and/or an indication of a previous overstress condition (i.e., the stored overstress condition indication 111).

Referring back to FIGS. 1A and 1B, the sense circuit 102 is any component that provides information 103 with respect to a monitored parameter 101. For example, in one embodiment, the sense circuit 102 is a sensor (e.g., a voltage sensor, a current sensor, a temperature sensor, a power sensor, a moisture sensor) configured to monitor a desired parameter and provide a sense signal 103 corresponding to the monitored parameter (e.g., voltage, current, power, temperature, etc.). In one embodiment the sense signal has a voltage level that corresponds to the monitored parameter; however, in other embodiments the sense signal is configured differently. In another embodiment, the sense circuit 102 is an input line coupled to another component (e.g., a battery, a node, a sensor, a controller, a processor) within the device and configured to receive information 103 (e.g., a sense voltage) from the component within the device.

The sense circuit 102 provides the information 103 regarding the monitored parameter 101 to the detection circuit 104. The detection circuit 104 determines whether the information received from the sense circuit 102 indicates an overstress condition. In response to receiving information from the sense circuit 102 that indicates an overstress condition, the detection circuit 104 generates a detection signal 105. In one embodiment, the detection signal 105 simply indicates that an overstress condition has been sensed. In another embodiment, the detection signal 105 also includes additional information regarding the sensed parameter (e.g., a specific level of the sensed parameter) that resulted in the identification of the overstress condition. The detection signal 105 can be provided to the memory circuit 106 and/or the controller 112 (e.g., the control function module 116 of the controller 112 as discussed above).

The overstress indicator circuit 100 may be configured to monitor any number of different electrical and/or environmental parameters associated with a device. For example, in one embodiment, the overstress indicator circuit 100 is configured as an overvoltage indicator and the sense circuit 102 is a voltage sensor. According to one embodiment where the sense circuit 102 is configured as a voltage sensor in a mobile device, the sense circuit 102 may simply be an input line coupled to the battery or another node of the mobile device. The detection circuit 104 compares the voltage across the battery or the node (via the input line 102) with a reference voltage and in response to the voltage across the battery/node exceeding the reference voltage, the detection circuit 104 outputs a detection signal 105 indicating the overvoltage condition (i.e., a voltage over a predetermined threshold set by the reference voltage).

According to another embodiment, the overstress indicator circuit 100 is configured as an overcurrent indicator and the sense circuit 102 is a current sensor. According to one embodiment in which the sense circuit 102 is configured as a current sensor in a mobile device, the sense circuit 102 is a current sensor coupled to a battery or node of the mobile device. The current sensor 102 outputs a voltage having a level dependent on the current provided to, or from, the battery/node. The detection circuit 104 compares the voltage from the current sensor 102 with a reference voltage and in response to the voltage from the current sensor 102 exceeding the reference voltage, the detection circuit 104 outputs a detection signal 105 indicating the overcurrent condition (i.e., an input current or an output current over a predetermined threshold).

According to another embodiment, the overstress indicator circuit 100 is configured as an over-temperature indicator and the sense circuit 102 is a temperature sensor. According to one embodiment in which the sense circuit 102 is configured as a temperature sensor in a mobile device, the sense circuit 102 is a thermistor. The thermistor 102 may be configured to monitor ambient temperature in the mobile device or the temperature of a specific component within the mobile device. The thermistor 102 has a resistance that varies depending on temperature. Accordingly, when a voltage is applied to an input of the thermistor 102, the output voltage read out from the thermistor 102 will vary depending on its temperature. The output voltage from the thermistor 102 is provided to the detection circuit 104 and the detection circuit 104 compares the voltage from the thermistor 102 with a reference voltage. In response to the voltage from the thermistor 102 exceeding the reference voltage, the detection circuit 104 outputs a detection signal 105 indicating the over-temperature condition (i.e., a temperature over a predetermined threshold).

In another embodiment in which the sense circuit 102 is configured as an over-temperature sensor in a mobile device, the sense circuit 102 is a Proportional To Absolute Temperature (PTAT) circuit that provides a voltage to the detection circuit 104 having a level dependent on a level of a monitored temperature. In other embodiments, a different temperature dependent circuit may be utilized as the sense circuit 102.

According to other embodiments, the overstress indicator circuit 100 may be configured to monitor any other type of parameter which may indicate an overstress condition in a mobile device. For example, in some embodiments, the overstress indicator circuit 100 may be configured as a force indicator having a sense circuit 102 including an accelerometer and configured to monitor acceleration of the mobile device, as a moisture indicator having a sense circuit 102 configured to identify whether the mobile device is exposed to a liquid or excessive moisture, as an ESD indicator having a sense circuit 102 configured to indicate whether the mobile device was exposed to an unacceptable Electro-Static Discharge (ESD) event, and/or as an RF power indicator having an RF power sensor 102 located within the mobile device (e.g., connected to an RF coupler) that is configured to monitor RF power incident on the sensor 102.

Figure 2A:
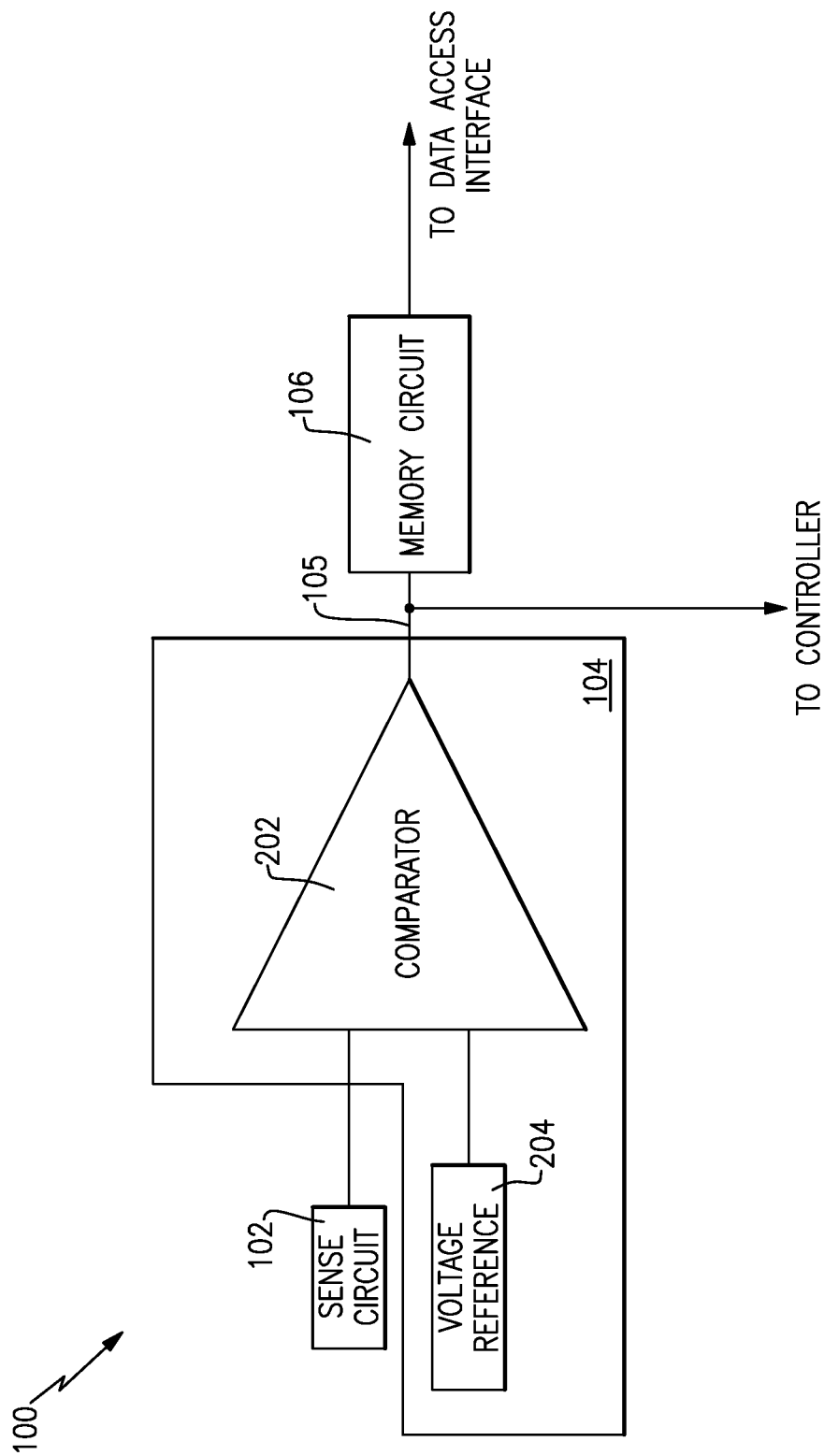
FIG. 2A is a block diagram of one embodiment of a detection circuit in accordance with aspects of the present invention.

FIG. 2A is a more detailed block diagram of one embodiment of the detection circuit 104 in accordance with one embodiment. As shown in FIG. 2A, the detection circuit 104 includes a comparator 202 and a voltage reference 204. The sense circuit 102 and the voltage reference 204 are coupled to input terminals of the comparator 202. The memory circuit 106 and the controller 112 (e.g., the control function module 116 of the controller 112) are coupled to the output terminal of the comparator 202.

The voltage reference 204 is configured to provide a stable reference voltage to the comparator 202. In one embodiment, the voltage reference is a bandgap voltage reference; however, in other embodiments, any other appropriate type of voltage reference may be utilized. As described above, the sense circuit 102 is any component that provides information 103 with respect to a monitored parameter (e.g., a sense signal having a voltage level dependent on the monitored parameter). The comparator 202 is configured to compare the reference voltage from the voltage reference 204 with the voltage of the sense signal 103 from the sense circuit 102. The comparator 202 outputs the detection signal 105 at a first level (e.g., a low signal) in response to the voltage from the sense circuit 102 being less than the reference voltage and outputs the detection signal 105 at a second level (e.g., a high signal) in response to the voltage from the sense circuit 102 being greater than the reference voltage.

The controller 112 (e.g., the control function module 116 of the controller 112) receives the detection signal 105 from the comparator 202 and may operate the corresponding device based the detection signal 105. For example, according to one embodiment, in response to receiving a high detection signal 105 (indicating that the voltage from the sense circuit 102 is greater than the voltage reference 204), the control function module 116 may turn off the PA 110 to prevent damage to the PA 110. After turning off the PA 110 and upon receiving a low detection signal 105 (indicating that the voltage from the sense circuit 102 has fallen below the voltage reference 204), the control function module 116 may turn on the PA 110. According to other embodiments, the control function module 116 may be configured to operate the corresponding device in another appropriate way based on the detection signal 105.

The memory circuit 106 also receives the detection signal 105 from the comparator 202. According to at least one embodiment, the memory circuit 106 is configured to be permanently altered into a state indicating an overstress condition in response to receiving the detection signal 105 from the comparator 202 indicating that the voltage from the sense circuit 102 exceeds the reference voltage (e.g., a high detection signal 10). However, in other embodiments, any other appropriate type of memory circuit 106 may be utilized. In at least one embodiment, the memory circuit 106 also is configured to either provide an overstress condition indication 111 to the data access interface 108 in response to its state being permanently altered or to permit access to the overstress condition indication stored in the memory circuit 106 via the data access interface 108. Operation of the memory circuit 106 is discussed in greater detail below with respect to FIG. 3.

As described above, the detection circuit 104 is configured to determine whether the parameter monitored by the sense circuit 102 exceeds a single threshold. However, in at least one other embodiment, the detection circuit 104 is configured to compare information regarding a monitored parameter from the sense circuit 102 to multiple different thresholds to further define the monitored parameter in relation to each threshold. For example, FIG. 2B is a block diagram of another embodiment of the detection circuit 104 where the detection circuit 104 operates as an Analog to Digital (A/D) converter by receiving an analog indication of a parameter monitored by the sense circuit 102 and converting the analog indication into a digital signal that includes specific information regarding the parameter sensed by the sense circuit 102.

Figure 2B:
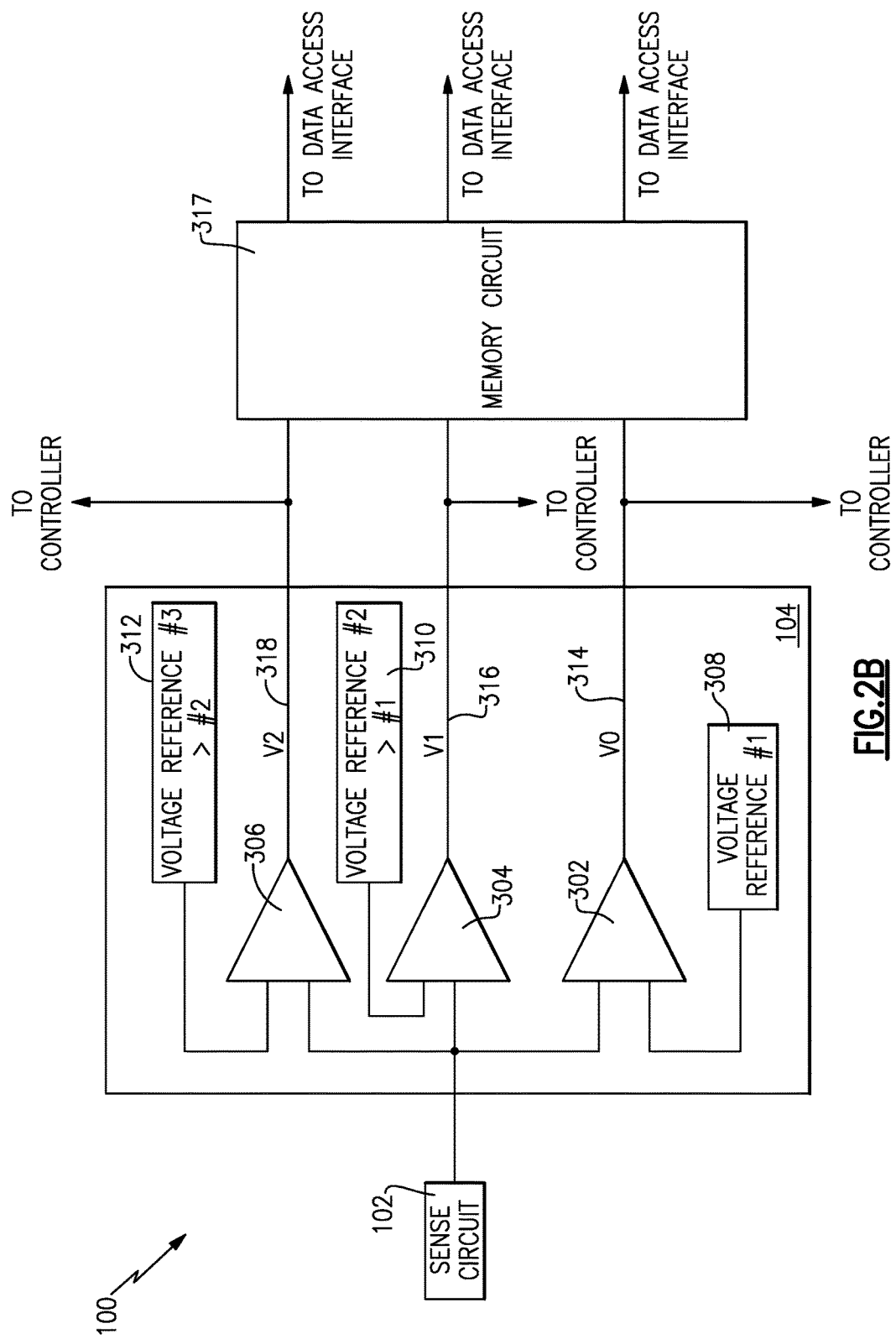
FIG. 2B is a block diagram of another embodiment of a detection circuit in accordance with aspects of the present invention.

As shown in FIG. 2B, the detection circuit 104 includes a first comparator 302, a second comparator 304, a third comparator 306, a first reference voltage 308, a second reference voltage 310 greater than the first reference voltage 308, and a third reference voltage 312 greater than the second reference voltage 310. A first input terminal of each comparator 302, 304, 306 is coupled to the sense circuit 102. A second input terminal of the first comparator 302 is coupled to the first reference voltage 308. A second input terminal of the second comparator 304 is coupled to the second reference voltage 310. A second input terminal of the third comparator 306 is coupled to the third reference voltage 312.

The sense circuit 102 operates as described above with respect to FIG. 2A (i.e., the sense circuit 102 is a component that provides information 103 with respect to a monitored parameter). For example, in one embodiment, the sense circuit 102 is a sensor (e.g., a thermistor or PTAT circuit) that generates a signal having a voltage level corresponding to a level of a sensed parameter (e.g., temperature). However, in other embodiments, the sense circuit 102 may be another type of circuit/component that is configured to generate a signal at a voltage level corresponding to a level of another sensed parameter.

The voltage from the sense circuit 102 is provided to the first terminal of each comparator 302, 304, and 306. The first comparator 302 compares the voltage from the sense circuit 102 with the first reference voltage 308. In response to the voltage from the sense circuit 102 being less than the first reference voltage 308, the first comparator 302 outputs a low voltage signal (V0 314). In response to the voltage from the sense circuit 102 being greater than the first reference voltage 308, the first comparator 302 outputs a high voltage signal (V0 314). The second comparator 304 compares the voltage from the sense circuit 102 with the second reference voltage 310. In response to the voltage from the sense circuit 102 being less than the second reference voltage 310, the second comparator 304 outputs a low voltage signal (V1 316).

In response to the voltage from the sense circuit 102 being greater than the second reference voltage 310, the second comparator 304 outputs a high voltage signal (V1 316). The third comparator 306 compares the voltage from the sense circuit 102 with the third reference voltage 312. In response to the voltage from the sense circuit 102 being less than the third reference voltage 312, the third comparator 306 outputs a low voltage signal (V2 318). In response to the voltage from the sense circuit 102 being greater than the third reference voltage 312, the third comparator 306 outputs a high voltage signal (V2 318).

Voltage signal V0 314, voltage signal V1 316, and voltage signal V2 318 are each provided to the controller 112 (e.g., the control function module 116 of the controller 112). The control function module 116 may be configured to operate a corresponding device based on the voltage signals 314, 316, 318 as similarly described above. For example, according to one embodiment, in response to receiving voltage signals 314 316, 318 from the detection circuit 104 indicating that the voltage received from the sense circuit 102 is greater than the third reference voltage 312 (indicating that the monitored parameter is in the highest defined range), the control function module may cause a PA of the corresponding device to turn off. However, in response to receiving voltage signals 314 316, 318 from the detection circuit 104 indicating that the voltage received from the sense circuit 102 is less than the third reference voltage 312, the control function module may not take any action. According to other embodiments, the control function module 116 may be configured to respond to the voltage signals 314, 316, in 318 (i.e., operate the corresponding device) in another appropriate way.

Voltage signal V0 314, voltage signal V1 316, and voltage signal V2 318 are each also provided to a memory circuit 317. According to one embodiment, the memory circuit 317 is similar to the memory circuit 106 described above with regard to FIG. 2A. For instance, the memory circuit 317 receives the voltage signals (V0 314, V1 316, or V2 318) from the comparators (302, 304, 306) and is configured to be permanently altered into a different state depending on the status of each of the voltage signals (V0 314, V1 316, or V2 318). For example, in response to the memory circuit 317 receiving a high voltage signal V0 314 (i.e., indicating that the voltage of the sense signal from the sense circuit 102 is greater than the first reference voltage 308), a first memory element of the memory circuit 317 is altered into a first state, in response to the memory circuit 317 receiving a high voltage signal V1 316 (i.e., indicating that the voltage of the sense signal from the sense circuit 102 is greater the second reference voltage 310), a second memory element of the memory circuit 317 is altered into a second state, and in response to the memory circuit 317 receiving a high voltage signal V2 318 (i.e., indicating that the voltage of the sense signal from the sense circuit 102 is greater than the third reference voltage 312), a third memory element of the memory circuit 317 is altered into a third state. However, in other embodiments, any other appropriate type of memory circuit may be utilized. In at least one embodiment, the memory circuit 317 is also configured to provide an indication of its current state to the data access interface 108 in response to its state being permanently altered.

External circuitry and/or a component (e.g., a processor or other circuitry) within the same device may analyze the state of the memory elements in the memory circuit 317 (e.g., via the data access interface 108) to identify specific information regarding the level of the voltage signal provided by the sense circuit 102 (corresponding to the level of the parameter monitored by the sense circuit 102) based on the state of the memory elements within the memory circuit 317. For example, by analyzing the state of the memory circuit 317 (i.e., the state of each memory element in the memory circuit 317), the external circuitry and/or component can determine whether the voltage received from the sense circuit 102 is less than the first reference voltage 308 (indicating that the sensed parameter is less than a level corresponding to the first reference voltage 308), between the first reference voltage 308 and the second reference voltage 310 (indicating that the sensed parameter is at a level corresponding to a voltage level between the first reference voltage 308 and the second reference voltage 310), or greater than the third reference voltage 312 (indicating that the sensed parameter is greater than a level corresponding to the third reference voltage 314). Based on the analysis of the memory circuit 317, the external circuitry or component (e.g., a processor or other circuitry) can more specifically identify a fault state of the device in which the overstress indicator circuit 100 is included and/or control operation of the device with greater precision.

According to other embodiments, the detection circuit 104 and the memory circuit 317 may be configured to identify the voltage signal from the sense circuit 102 as being in one of any number of different ranges (i.e., may include any number of comparators and memory elements) and may be configured to monitor another type of sense circuit 102.

As described above, the detection circuit 104 is configured to receive information 103 from the sense circuit 102 regarding a monitored parameter and generate the detection signal 105 based on the information. According to one embodiment, the detection signal 105 may only indicate whether the information from the sense circuit 102 indicates an overstress condition or not. For example, in such an embodiment, the detection signal 105 may only have two states (e.g., a low state indicating that the information received from the sense circuit 102 does not indicate an overstress condition and a high state indicating that the information received from the sense circuit 102 indicates an overstress condition).

Figure 3:
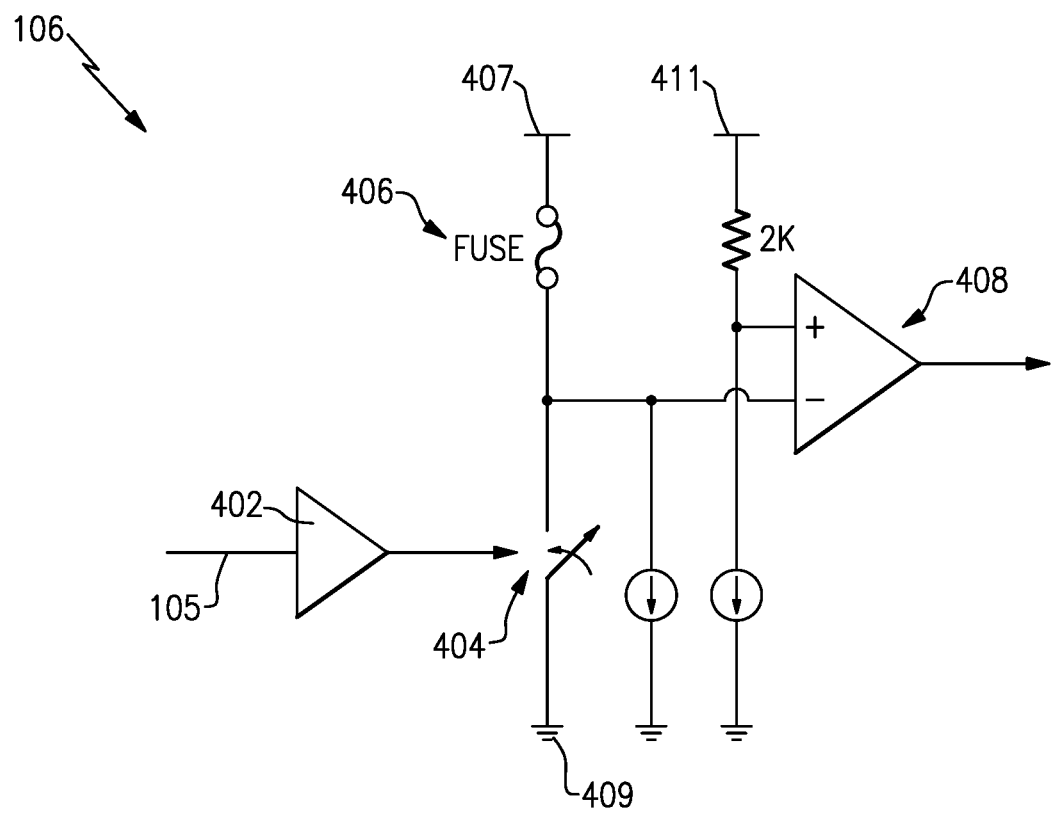
FIG. 3 is a circuit diagram of one embodiment of a memory circuit in accordance with aspects of the present invention.

The memory circuit 106 is configured to receive the detection signal 105 from the detector 104, determine whether the detector has identified an overstress condition, and either provide an indication 111 of an identified overstress condition to the data access interface 108 or permit access to the memory circuit 106 to access the indication 111 via the data access interface 108. According to one embodiment, the memory circuit 106 includes a memory element that is configured to be permanently altered in response to receiving a detection signal 105 from the detection circuit 104 indicating an overstress condition and a memory element detection circuit that is configured to identify when the memory element has been permanently altered and output an overstress condition indication indicating as such. For example, in one embodiment, the memory element of the memory circuit 106 is a fuse. FIG. 3 is a circuit diagram of one embodiment of a memory circuit 106 in which the memory element is a fuse.

The memory circuit 106 includes a buffer 402, a fuse switch 404, a fuse 406, and a fuse sense comparator 408. An input terminal of the buffer 402 is coupled to the detection circuit 104 and is configured to receive the detection signal 105 from the detection circuit 104. An output terminal of the buffer 402 is coupled to the fuse switch 404. A first terminal of the fuse 406 is coupled to a supply 407 and the second terminal of the fuse 406 is selectively coupled to ground 409 via the fuse switch 404. A non-inverting terminal of the fuse sense comparator 408 is coupled to a supply 411 through a resistor and an inverting terminal of the fuse sense comparator 408 is coupled to the second terminal of the fuse 406. Supply 407 and supply 411 may be connected to the same supply voltage. The output terminal of the fuse sense comparator 408 is coupled to the data access interface 108. In one embodiment, the fuse 406 is a polysilicon fuse; however, in other embodiments, the fuse 406 may be another appropriate type of fuse.

In operation, the buffer 402 passes the detection signal 105 from the detection circuit 104 to the fuse switch 404. In response to receiving a low detection signal 105 from the detection circuit 104 (indicating that an overstress condition has not been detected), the fuse switch 404 is maintained in an open state. In response to the fuse switch 404 being in an open state, the fuse 406 is in a low-impedance state (e.g., has an impedance of about 70 Ohms) and the voltage applied to the inverting terminal of the fuse sense comparator 408 is greater than the voltage applied to the non-inverting terminal of the fuse sense comparator 408. As such, the output of the fuse sense comparator 408, provided to the data access interface 108, is low (indicating that an overstress condition has not been sensed).

In response to receiving a high detection signal 105 from the detection circuit 104 (indicating that an overstress condition has been detected), the fuse switch 404 is closed. In response to the fuse switch 404 closing, a short circuit is created between the supply 407 and ground 409 and the resulting high current through the fuse 406 causes the migration of the fuse material and the altering of the fuse 406 into a permanent high impedance state. Once the fuse 406 is altered into a permanent high impedance state (e.g., having an impedance greater than 5 k Ohm), the voltage applied to the inverting terminal of the fuse sense comparator 408 is less than the voltage applied to the non-inverting terminal of the fuse sense comparator 408. As such, the output of the fuse sense comparator 408, provided to the data access interface 108, is high (indicating that an overstress condition has been sensed).

According to other embodiments, the memory circuit 106 may be configured in another appropriate way to permanently store an indication that an overstress condition has been sensed and provide an output signal indicating that an overstress condition has been sensed. For example, in one embodiment, the buffer 402 is replaced by an AND gate that receives the detection signal 105 from the detection circuit 104 and an enable signal from a controller (e.g., controller 112). In such an embodiment, a high signal is only output to the fuse switch 404 by the AND gate (i.e., to close the fuse switch 404) when both the detection signal 105 and the enable signal are high. By controlling the enable signal, the controller can enable or disable the overstress monitoring function of the memory circuit 106.

According to another embodiment, the memory circuit 106 includes an antifuse memory element and a circuit configured to monitor the state of the antifuse memory element. The antifuse memory element is typically in a high impedance state and the memory circuit 106 is configured to alter the antifuse memory element into a permanent low impedance state in response to receiving a high detection signal 105 from the detection circuit 104 (i.e., indicating that an overstress condition has been sensed). The memory circuit 106 is further configured to monitor the status of the antifuse memory element and provide an indication to the data access interface 108 that an overstress condition has been sensed in response to sensing that the antifuse memory element is in a low impedance state.

According to another embodiment, the memory circuit 106 includes a transistor based memory element. For example, in one embodiment, the transistor based memory element in the memory circuit 106 includes a Field Effect Transistor (FET) coupled to the detection circuit 104. In response to the detection signal 105 output by detection circuit 104 going high (indicating that the sensed parameter is above a threshold), the high voltage applied to the FET breaks down the gate oxide of the FET and a resistive connection between the gate and the channel of the FET is formed. As a result, the gate of the FET is permanently pulled in a low state and cannot be pulled high. The gate of the FET is coupled to the data access interface 108 such that a component or other circuitry (e.g., a processor) in communication with the data access interface 108 can monitor the state of the gate via the data access interface. Upon seeing the gate go low, the component or circuitry can identify that an overstress condition has been sensed in the corresponding device.

In other embodiments, the memory circuit 106 of the overstress indicator circuit 100 may include another type of memory element that is configured in a first state when a first condition (e.g., a low output signal from the detection circuit 104) is met and is permanently configured in a second state when a second condition (e.g., a high output signal from the detection circuit 104) is met. The permanent configuration of the memory element in the second state indicates to a corresponding memory element detection circuit that that overstress condition has been sensed. As a result of identifying that an overstress condition has been sensed, the memory element detection circuit outputs an overstress condition indication, via the data access interface 108, to another component and/or circuit in communication with the data access interface 108. As such, the component and/or circuit in communication with the data access interface 108 can non-destructively identify that an overstress condition was sensed in the corresponding electronic device.

As described above, the sense circuit 102 and detection circuit 104 are separate circuits; however, in other embodiments, the sense circuit 102 and detection circuit 104 may be combined into a single circuit. As also described above, according to one embodiment, the detection circuit 104 is configured to provide its detection signal to the memory circuit 106; however, in at least one embodiment, the circuit 100 does not include a memory circuit 106 and the detection signal is provided directly to the data access interface 108 (i.e., directly to a component and/or circuit in communication with the data access interface 108).

As described above, the overstress indicator circuit 100 is implemented within a controller 112 and the detection circuit 104 is configured to provide information regarding a monitored parameter directly to the controller 112 (e.g., via a control function module 116). However, in at least one other embodiment, the overstress indicator circuit 100 may be located separate from the controller 112 and be configured to either provide the overstress condition indication 111 to the controller 112 via the data access interface 108 or permit access to the overstress condition indication stored in the memory circuit 106 via the data access interface 108. In such an embodiment, the controller 112 may operate a corresponding electronic device based on the overstress condition indication 111. For example, similarly as described above, the controller 112 may operate a PA of a wireless device based on the overstress condition indication 111.

The overstress indicator circuit 100 may be configured to monitor, with multiple sense circuits 102, multiple parameters to determine whether an overstress condition exists in a device. In at least one embodiment, the overstress indicator circuit 100 may be configured to monitor any number, and/or type, of parameter which may indicate an overstress condition in a device. In another embodiment, the overstress indicator circuit 100 may compare a monitored parameter with multiple different thresholds and the status of the monitored parameter in relation to each threshold may be detected and provided to the memory circuit 106, an external party, or another component in communication with the overstress indicator circuit 100 as described above.

As described above, in one embodiment, the overstress indicator circuit 100 is implemented within a controller 112 that is located within the same packaged module 114 as a power amplifier 110. The packaged module 114 is included in a package 115. In one embodiment, the package 115 includes a plurality of different dies (e.g., 3-6 dies) located on a substrate, such as a circuit board constructed of glass epoxy laminate, a ceramic substrate, etc.; however, in other embodiments, the dies may be located on a circuit board constructed of another appropriate material. The controller 112, overstress indicator circuit 100, power amplifier 110, and the other components of the module 114 are fabricated on the dies of the package 115 and encapsulated in plastic or other molding compound, such as SU-8. The package 115 can include contacts, such as pins, sockets, ball, pads, lands, etc., corresponding to each port of the controller 112, the overstress indicator circuit 100, the PA 110, or other components within the packaged module 114. For example, in one embodiment, the package 115 includes a first contact 109 corresponding to the serial data port 107 and another contact (not shown) corresponding to the clock port. According to other embodiments, the package 115 can include any other appropriate number or type of contacts configured in any number of ways. For example, in one embodiment, the package 115 includes contact pads located on the back side of the module 114. In other embodiments, the package 115 includes a land grid array or a ball grid array on the back side of the package 115.

As described above, the controller 112 and overstress indicator circuit 100 are integrated in the same packaged module as the PA 110. In other embodiments, the controller 112, overstress indicator circuit 100, and corresponding packaged module can include multiple different components and be configured in a variety of different ways.

Figure 4A:
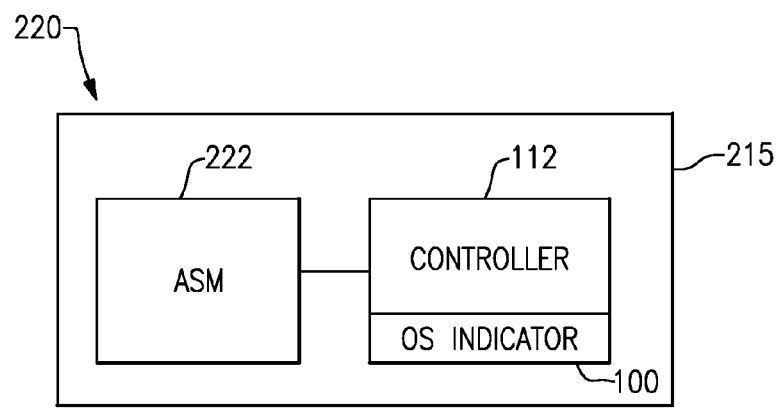
FIG. 4A is a block diagram of a packaged module in accordance with aspects of the present invention.
Figure 4B:
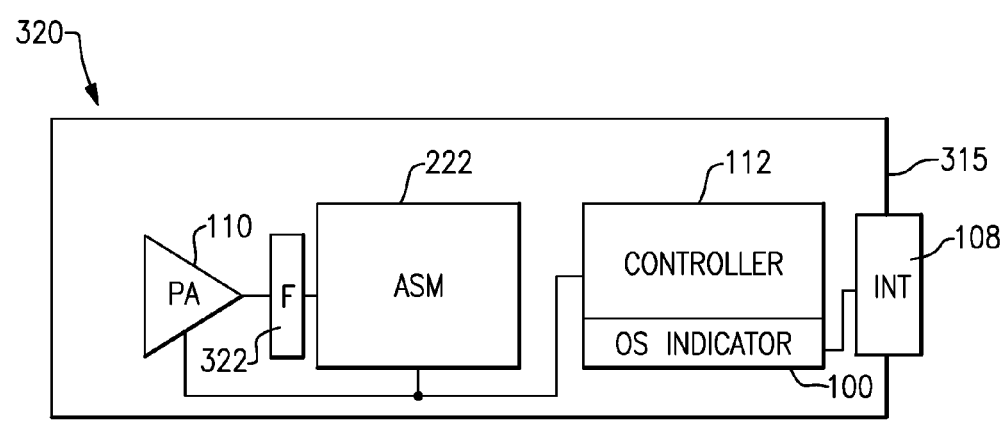
FIG. 4B is a block diagram of another packaged module in accordance with aspects of the present invention.

For example, FIG. 4A is a block diagram of a packaged module 220 that includes the controller 112 (including the overstress indicator circuit 100) and an Antenna Switch Module (ASM) 222. As shown in FIG. 4A, the package 215 encases both the controller 112 and the antenna switch module 222. In another example shown in FIG. 4B, a packaged module 320 includes the controller 112 (including the overstress indicator circuit 100), the ASM 222, the PA 110, and a filter 322. In other embodiments, the packaged module 320 may include multiple power amplifiers 110, each coupled to the ASM 222 via a filter 322. The packaged module 320 includes these elements within a common package 315. The packaged module including the controller 112 and overstress indicator circuit 100 (shown in FIGS. 1A-1B and 4A-4B) may also include any number and/or type of different components within the common package 315.

As similarly described above, the controller 112 is configured to receive an overstress condition indication from the overstress indicator circuit 100. Upon receiving the overstress condition indication, the controller 112 may recognize that the overstress indicator circuit 100 has identified an overstress condition and as a result, take action to prevent damage to the device (e.g., cause the PA 110 to shut down). In other embodiments, the package may include a Low Noise Amplifier (LNA) for receive functions, filters for transmit and receive functions, switches to selectively couple different antennas and/or filters, a current sensor, a voltage sensor, a temperature sensor, an accelerometer, or other types of overstress indicator circuits and associated sensors.

The packaged module including the controller 112 and overstress indicator circuit 100 (e.g., as shown in FIGS. 1A-1B and 4A-4B) may be configured to communicate with any number and/or type of different devices. For example, in one embodiment, the packaged module is coupled to a DC/DC converter (e.g., a Buck/Boost converter) and is configured to receive DC power from the DC/DC converter. In another embodiment, the packaged module is in communication with another PA and/or RF element. In another embodiment, the packaged module is in communication with a processor. In other embodiments, the packaged module is in communication with a camera, an accelerometer, or another type of sensor. The packaged module may be in communication with any other device or component within the mobile device.

In one embodiment, the packaged module communicates with the other devices in the mobile device via the data access interface 108 (e.g., a MIPI Alliance Specification for RF Front-End (RFFE) Control Interface or another serial bus/interface). For example, in one embodiment, the packaged module (i.e., components within the packaged module such as the controller 112, the OS indicator circuit 100, the ASM 222, the PA 110, etc.) communicates with a processor of the mobile device (e.g., handling the mobile device's User Interface (UI), GPS, magnetic sensor, accelerometers, camera, etc.) via the data access interface 108. In other embodiments, the packaged module can communicate with any other device or component in the mobile device via the data access interface 108.

Embodiments of the overstress indicator circuit 100 disclosed herein, optionally packaged into one of the packaged modules 114, 220, 320 discussed above, may be advantageously used in a variety of electronic devices, such as wireless devices (e.g., cell phones, tablets, etc.).

Figure 5:
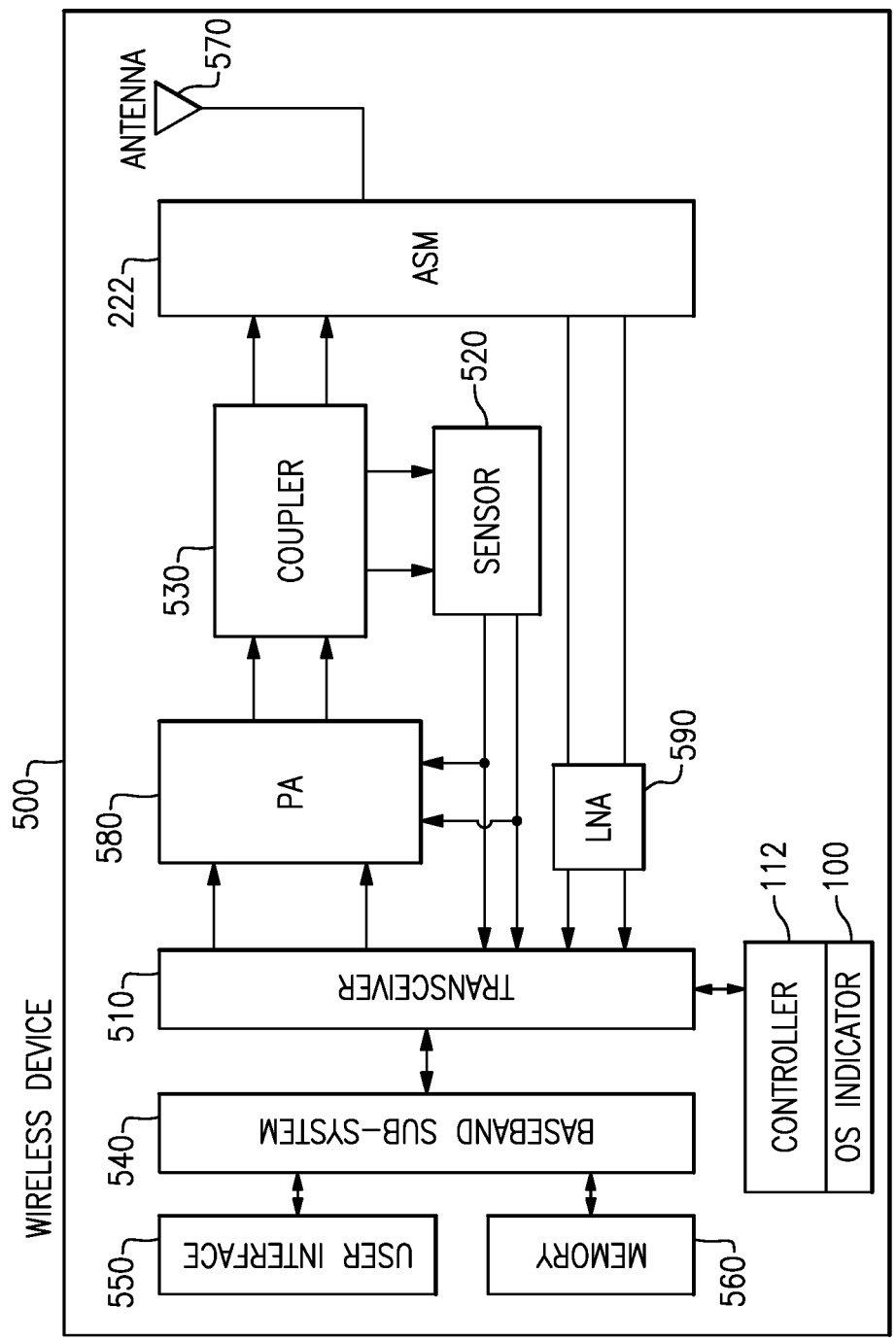
FIG. 5 is a block diagram of a wireless device in accordance with aspects of the present invention.

FIG. 5 is a block diagram of one example of a wireless communications device 500 in which embodiments of one of the packaged modules 114, 220, 320 can be used. The wireless device 500 can be a mobile phone, such as a smart phone, for example. By way of example, the wireless device 500 can communicate in accordance with Long Term Evolution (LTE). In this example, the wireless device 500 can be configured to operate at one or more frequency bands defined by an LTE standard. The wireless device 500 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 5, the wireless device 500 can include an antenna 570 and a transceiver 510. The transceiver 510 can generate RF signals for transmission via the antenna 570. Furthermore, the transceiver 510 can receive incoming RF signals from the antenna 570. It will be understood that various functionalities associated with transmitting and receiving of RF signals can be achieved by one or more components that are collectively represented in FIG. 5 as the transceiver 510. For example, a single component can be configured to provide both transmitting and receiving functionalities. In another example, transmitting and receiving functionalities can be provided by separate components.

In one embodiment, the wireless device 500 includes a power amplifier module 580, which can include adaptive grounding. Signals generated for transmission are received by the power amplifier (PA) module 580, which amplifies the generated signals from the transceiver 510. As will be appreciated by those skilled in the art, the power amplifier module 580 can include one or more power amplifiers (e.g., a power amplifier 110 as discussed above). The power amplifier module 580 can be used to amplify a wide variety of RF or other frequency-band transmission signals. For example, the power amplifier module 580 can receive an enable signal that can be used to pulse the output of the power amplifier to aid in transmitting a wireless local area network (WLAN) signal or any other suitable pulsed signal. The power amplifier module 580 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 580 and associated components including switches and the like can be fabricated on GaAs substrates using, for example, pHEMT or BiFET transistors, or on a Silicon substrate using CMOS transistors.

In certain embodiments, the wireless device 500 also includes a coupler 530 and sensor 520 for measuring the power levels of transmitted signals from the power amplifier module 580. The sensor 520 can send information to the transceiver 510 and/or directly to the power amplifier module 580 as feedback for making adjustments to regulate the power level of the transmitted signals or gain of the power amplifier module 580, for example. In certain embodiments in which the wireless device 500 is a mobile phone having a time division multiple access (TDMA) architecture, the coupler 530 can advantageously manage the amplification of an RF transmitted power signal from the power amplifier module 580. In a mobile phone having a time division multiple access (TDMA) architecture, such as those found in Global System for Mobile Communications (GSM), code division multiple access (CDMA), and wideband code division multiple access (W-CDMA) systems, the power amplifier module 580 can be used to shift power envelopes up and down within prescribed limits of power versus time. For instance, a particular mobile phone can be assigned a transmission time slot for a particular frequency channel. In this case the power amplifier module 580 can be employed to aid in regulating the power level one or more RF power signals over time, so as to prevent signal interference from transmission during an assigned receive time slot and to reduce power consumption. In such systems, the coupler 530 and sensor 520 can be used to measure the power of a power amplifier output signal to aid in controlling the power amplifier module 580, as discussed above.

The wireless device 500 can further include an antenna switch module 222, for example as described above, which can be configured to switch between different bands and/or modes, transmit and receive modes etc. As shown in FIG. 5, in certain embodiments the antenna 570 both receives signals that are provided to the transceiver 510 via the antenna switch module 222 and also transmits signals that are received from the transceiver 510 via antenna switch module 222. However, in other examples multiple antennas can be used. The antenna switch module 222 can include adaptive grounding.

In the receive path, the wireless device 500 may include a low noise amplifier (LNA) module 590, which may include one or more low noise amplifiers configured to amplify the received signals. The low noise amplifier module 590 may also include adaptive grounding. In other examples the power amplifier module 580 and low noise amplifier module 590 can be combined, optionally with some or all of the functionality of the transceiver 510.

Still referring to FIG. 5, the wireless device 500 further includes a controller 112, for example as discussed above. The controller 112 can include any number of sub-controllers or processors, can control the transmission of signals, and can also configure various components of the wireless device 500. The controller 112 can further include a power management system (not shown) that is connected to the transceiver 510 and that manages the power for the operation of the wireless device. The power management system can also control the operation of a baseband sub-system 540 and other components of the wireless device 500. The power management system can include, or can be connected to, a battery (not shown) that supplies power for the various components of the wireless device 500. In one embodiment, the baseband sub-system 540 is connected to a user interface 550 to facilitate various input and output of voice and/or data provided to and received from the user. The baseband sub-system 540 can also be connected to non-transient computer readable memory 560 that is configured to store data and/or instructions to facilitate the operation of the wireless device, and/or to provide storage of information for the user.

As another example, the controller 112 can also include one or more of the overstress indicator circuits 100, as described above. The controller 112 can receive overstress and/or parameter information from one or more overstress indicators 100 and operate one ore more components of the wireless device 500 (e.g., the PA module 580) based on the received information.

As will be appreciated by those skilled in the art, implementation shown in FIG. 5 is exemplary and non-limiting. The wireless device 500 can include elements that are not illustrated in FIG. 5 and/or a sub-combination of the illustrated elements. Further, the components of the wireless device 500 can be arranged in a manner different from that shown in FIG. 5. Some of the embodiments described above have provided examples in connection with mobile devices. However, the principles and advantages of the embodiments can be used for any other systems or apparatus, such as any uplink cellular device, that could benefit from any of the circuits described herein. Any of the principles and advantages discussed herein can be implemented in an electronic system that uses mixed-signal dies. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

Some of the embodiments described above have provided examples in connection with power amplifiers and/or mobile devices. However, the principles and advantages of the embodiments can be used for any other systems or apparatus, such as any uplink cellular device, that could benefit from any of the circuits described herein. Any of the principles and advantages discussed herein can be implemented in an electronic system with a need for detecting and/or monitoring an overstress condition in the system. Any of the switch networks and/or switch circuits discussed herein can alternatively or additionally be implemented by any other suitable logically equivalent and/or functionally equivalent switch networks. The teachings herein are applicable to a variety of power amplifier systems including systems with multiple power amplifiers, including, for example, multi-band and/or multi-mode power amplifier systems. The power amplifiers discussed herein can be, for example, gallium arsenide (GaAs) based power amplifiers, complementary metal oxide semiconductor (CMOS) based power amplifiers, or silicon germanium (SiGe) transistor based power amplifiers. Moreover, power amplifiers discussed herein can be implemented by FETs and/or bipolar transistors, such as heterojunction bipolar transistors.

As described herein, an overstress indicator circuit is provided that monitors an electrical and/or environmental parameter of a corresponding electronic device (e.g., a mobile phone), indicates when an overstress condition exists in the device, stores information regarding the monitored parameter and/or any detected overstress conditions, and non-destructively provides the monitored parameter and/or overstress condition information to an external system or another component within the device. The overstress indicator circuit may assist an investigator in non-destructively identifying whether an overstress condition was present in the device, retrieving information from the device regarding the overstress condition, and determining whether a failure of the device was the result of a manufacturer's defect or an extreme condition imposed by a user or external event.

For example, by identifying an overvoltage condition at the battery of a mobile device, the investigator may identify that an unapproved charger was likely connected to the mobile device. In another example, by identifying an overcurrent condition to/from the battery of the mobile device, the investigator can identify that the mobile device may have been placed on a metal surface (e.g., a metal table), such as during transmission of a cellular signal. The metal surface acts as a ground plane, resulting in a high VSWR and a large impedance mismatch. This may cause the power supply of the mobile device to supply too much current to the corresponding PA to compensate for the mismatch.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An overstress indicator circuit comprising:
   a sense circuit configured to monitor a parameter of a device and generate a sense signal corresponding to the parameter;
   a detection circuit coupled to the sense circuit and configured to receive the sense signal from the sense circuit and generate a detection signal at a first level in response to a determination that the sense signal is indicative of an overstress condition in the device;
   an interface circuit; and
   a memory circuit coupled to the detection circuit and the interface circuit and configured to store an overstress condition indication for access via the interface circuit in response to receiving the detection signal at the first level.

2. The overstress indicator circuit of claim 1 wherein the interface circuit is a Mobile Industry Processor Interface (MIPI) Alliance Specification for RF Front-End (RFFE) Control Interface circuit.

3. The overstress indicator circuit of claim 1 wherein the detection circuit includes:
   a voltage reference configured to provide a reference voltage; and
   a comparator coupled to the voltage reference and the sense circuit, the comparator configured to compare the reference voltage with a voltage of the sense signal, to output the detection signal at a second level in response to determining that the voltage of the sense signal is less than the reference voltage, and to output the detection signal at the first level in response to determining that the voltage of the sense signal has exceeded the reference voltage.

4. The overstress indicator circuit of claim 3 wherein the sense circuit is one of an input line configured to be coupled to a node within the device and to provide the sense signal to the comparator in relation to a voltage across the node, a current sensor coupled to a node within the device and configured to output the sense signal to the comparator in relation to a current to or from the node, a temperature sensor located within the device and configured to output the sense signal to the comparator in relation to a temperature of the device, an accelerometer located within the device and configured to output the sense signal to the comparator in relation to an acceleration of the device, a moisture indicator located within the device and configured to output the sense signal to the comparator in relation to a determination by the liquid indicator that the device has been exposed to a liquid, an Electro-Static Discharge (ESD) indicator located within the device and configured to output the sense signal to the comparator in relation to an ESD incident on the device, and an RF power indicator located within the device and configured to output the sense signal to the comparator in relation to RF power incident on the device, and the comparator is further configured to output the detection signal at the first level in response to determining that the voltage of the sense signal from the sense circuit has exceeded the reference voltage.

5. The overstress indicator circuit of claim 3 wherein the memory circuit includes a memory element configured to be permanently altered into a state indicating an overstress condition in response to receiving the detection signal at the first level.

6. The overstress indicator circuit of claim 5 wherein the memory circuit further includes a memory element detection circuit coupled to the memory element and configured to generate the overstress condition indication in response to a determination that the memory element has been altered into the state indicating an overstress condition.

7. The overstress indicator circuit of claim 6 wherein the memory element is a polysilicon fuse configured to be fused open in response to receiving the detection signal at the first level, and the memory element detection circuit is further configured to monitor an impedance of the polysilicon fuse and generate the overstress condition indication in response to a determination that the impedance of the polysilicon fuse has been altered into a high-impedance state.

8. The overstress indicator circuit of claim 6 wherein the memory element is an antifuse element configured to be fused closed in response to receiving the detection signal at the first level, and the memory element detection circuit is further configured to monitor an impedance of the antifuse element and generate the overstress condition indication in response to a determination that the impedance of the antifuse element has been altered into a low-impedance state.

9. The overstress indicator circuit of claim 6 wherein the memory element includes a transistor having a gate that is permanently pulled low in response to receiving the detection signal at the first level, and the memory element detection circuit is further configured to monitor a voltage on the gate of the transistor and generate the overstress condition indication in response to a determination that the voltage on the gate of the transistor has dropped below a threshold.

10. The overstress indicator circuit of claim 1 wherein the detection circuit is further configured to generate the detection signal at the first level in response to a determination that a voltage of the sense signal is greater than a first reference voltage, to generate the detection signal at a second level in response to a determination that the voltage of the sense signal is in a range between a second reference voltage and the first reference voltage, and to generate the detection signal at a third level in response to a determination that the voltage of the sense signal is in a range between a third reference voltage and the second reference voltage.

11. The overstress indicator circuit of claim 10 wherein the memory circuit includes a first memory element configured to be permanently altered in response to receiving the detection signal at the first level, a second memory element configured to be permanently altered in response to receiving the detection signal at the second level, and a third memory element configured to be permanently altered in response to receiving the detection signal at the third level.

12. The overstress indicator circuit of claim 11 wherein the memory circuit further includes a memory element detection circuit coupled to the first memory element, the second memory element, and the third memory element, the memory element detection circuit configured to store information regarding the voltage of the sense signal for access via the interface circuit based on a status of the first memory element, the second memory element, and the third memory element, and to generate the overstress condition indication in response to a determination that the first memory element has been permanently altered.

13. A module comprising:
an overstress indicator circuit including a sense circuit configured to monitor a parameter of a device and generate a sense signal corresponding to the parameter, a detection circuit coupled to the sense circuit and configured to receive the sense signal from the sense circuit and generate a detection signal at a first level in response to a determination that the sense signal is indicative of an overstress condition in the device, an interface circuit, and a memory circuit coupled to the detection circuit and the interface circuit and configured to store an overstress condition indication for access via the interface circuit in response to receiving the detection signal at the first level; and
at least one power amplifier coupled to the interface circuit.

14. The module of claim 13 further comprising at least one filter coupled to the at least one power amplifier and an antenna switch module coupled to the at least one filter.

15. The module of claim 14 wherein at least one of the overstress indicator circuit, the at least one power amplifier, the at least one filter, and the antenna switch module are fabricated on at least one die.

16. The module of claim 15 wherein the at least one die is located on a circuit board constructed of glassy epoxy laminate.

17. The module of claim 15 wherein at least one of the overstress indicator circuit, the at least one power amplifier, the at least one filter, and the antenna switch module are encapsulated in a molding compound.

18. The module of claim 17 further comprising at least one contact coupled to at least one of the overstress indicator circuit, the at least one power amplifier, the at least one filter, and the antenna switch module.

19. A system comprising:
an overstress indicator circuit including a sense circuit configured to monitor a parameter of a device and generate a sense signal corresponding to the parameter, a detection circuit coupled to the sense circuit and configured to receive the sense signal from the sense circuit and generate a detection signal at a first level in response to a determination that the sense signal is indicative of an overstress condition in the device, an interface circuit, and a memory circuit coupled to the detection circuit and the interface circuit and configured to store an overstress condition indication for access via the interface circuit in response to receiving the detection signal at the first level;
at least one power amplifier coupled to the interface circuit; and
a controller coupled to the detection circuit of the overstress indicator circuit and configured to receive the detection signal from the detection circuit and operate the at least one power amplifier based on the detection signal.

20. The system of claim 19 further comprising:
an antenna switch module;
a transceiver coupled to the antenna switch module and configured to produce an RF transmit signal and to receive an RF receive signal; and
at least one antenna coupled to the antenna switch module and configured to transmit the RF transmit signal and to receive the RF receive signal.

* * * * *